(12) United States Patent
Mittal et al.

(10) Patent No.: US 11,200,127 B2
(45) Date of Patent: Dec. 14, 2021

(54) AUTOMATED SELF-CHECK OF A CLOSED LOOP EMULATION REPLAY

(71) Applicant: Synopsys, Inc., Mountain View, CA (US)

(72) Inventors: Ribhu Mittal, Hillsboro, OR (US); Vivek Prasad, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 11 days.

(21) Appl. No.: 16/846,710

(22) Filed: Apr. 13, 2020

(65) Prior Publication Data

US 2020/0327027 A1 Oct. 15, 2020

Related U.S. Application Data

(60) Provisional application No. 62/832,554, filed on Apr. 11, 2019.

(51) Int. Cl.
*G06F 11/273* (2006.01)
*G06F 11/26* (2006.01)
*G06F 11/27* (2006.01)
*G06F 11/263* (2006.01)

(52) U.S. Cl.
CPC .......... *G06F 11/261* (2013.01); *G06F 11/263* (2013.01); *G06F 11/27* (2013.01); *G06F 11/2733* (2013.01)

(58) Field of Classification Search
CPC .. G06F 11/261; G06F 11/2733; G06F 11/263; G06F 11/2635; G06F 30/32; G06F 11/3315
See application file for complete search history.

(56) References Cited

U.S. PATENT DOCUMENTS

| 5,475,583 | A   | * | 12/1995 | Bock ................. G05B 19/056 700/12 |
| 5,845,064 | A   |   | 12/1998 | Huggins |
| 7,031,900 | B1  | * | 4/2006  | Vakada ................ G06F 30/33 703/17 |
| 8,620,638 | B1  |   | 12/2013 | Chan et al. |
| 9,026,966 | B1  |   | 5/2015  | Ramachandran et al. |
| 2002/0004918 | A1 | * | 1/2002 | Mathieu ............... G06F 11/261 714/30 |
| 2009/0006894 | A1 | * | 1/2009 | Bellofatto .......... G06F 11/2236 714/34 |

(Continued)

*Primary Examiner* — Joseph O Schell
(74) *Attorney, Agent, or Firm* — Fenwick & West LLP

(57) ABSTRACT

A configuration for testing a design of an electronic circuit during a set of clock cycles. The test output of the emulation of a design is filtered based on a received testcase. To filter the test output, for each clock cycle in the testcase, a list of objects associated with a previous clock cycle in test case is identified. One or more objects associated with the one or more commands to be executed during the clock cycle is also identified. An updated list is generated by augmenting the list of objects associated with the previous clock cycle with the one or more objects associated with the one or more commands to be executed during the clock cycle. Output values for objects included in the updated list of objects is selected. The filtered test output is then stored in an activity database.

20 Claims, 8 Drawing Sheets

(56) References Cited

U.S. PATENT DOCUMENTS

| | | | |
|---|---|---|---|
| 2014/0123090 A1* | 5/2014 | Altieri | G06F 30/367 |
| | | | 716/111 |
| 2016/0124827 A1* | 5/2016 | Manoj Gangadhar | G06F 11/36 |
| | | | 702/182 |
| 2018/0007032 A1* | 1/2018 | Pappu | G06F 11/30 |
| 2018/0113169 A1* | 4/2018 | Birurakis | G01R 31/3177 |

* cited by examiner

AUTOMATED SELF-CHECK OF A CLOSED LOOP EMULATION REPLAY

CROSS REFERENCE TO RELATED APPLICATIONS

This application claims a benefit of U.S. patent application Ser. No. 62/832,554, filed Apr. 11, 2019, the contents of which is incorporated by reference herein.

TECHNICAL FIELD

The disclosure generally relates to the field of circuit emulation, and more specifically to analyzing nondeterministinc behavior of a design under test.

BACKGROUND

Emulation is rapidly becoming the primary tool for pre-silicon validation of complex semiconductor products. As illustrated in FIG. 1, these products frequently have several interfaces that that connect the chip to the outside world. These interfaces are completely asynchronous and operate independently of one another. For example: One can be listening to music while working on a document in MS office. In this case, keyboard device and speaker device are working simultaneously yet independently, and microprocessor is servicing instructions from both sources. Due to such asynchronous interactions, a symptom during validation of the semiconductor product may be seen very intermittently or, in the extreme case, only once. Emulation systems have capture and replay capabilities to debug such cases. However, there are many situations where the design values during replay do not match with the values in the original run. This divergence in values between the two runs, happens due to noise from oscillating design structures (e.g. loops), activation of debug logic, etc. As the results vary from run to run, it becomes difficult to filter out such noise from the system and isolate the real divergence caused due to design bug.

Current debug solutions perform a comprehensive spatial and temporal check on the entire design. These checks result in significant resource wastage in chasing divergences that are inconsequential to the overall test success criteria. Test success criteria is usually defined by the user at the time of creating the testcase. In a self-checking testcase, the execution results are compared against user defined criteria and testcase is considered pass/fail.

Currently, there is no systematic solution to debug such thousands of cases where rerun values diverge from original run values. When a divergence has occurred, any downstream design logic continues to diverge further. This compounds the problem even more. Engineers rely on intelligent guess work, trial and error and brute force to select one divergence point for investigation. This divergence point may not be the cause of test failure. Then the user picks another divergence point for investigation and goes through a detailed analysis again. This process is repeated until one divergence point is isolated that causes test failure. Given the large number of divergence points, the number of iterations used to debug are very high and the debug process through trial and error and brute force methods takes a long time.

Table 1 shows that the number of mismatches changes from run to run. In such cases, current debug strategy completely fails as the observed behavior continues to change in every subsequent runs. The present solution approach becomes completely ineffective because a previously diverging point may behave correctly while a completely new issue may appear in subsequent rerun. As a result, at the very least, there is schedule slip and a project gets delayed. In a worst case scenario, the problem is never debugged and the product is shipped out with a potential bug.

TABLE 1

Number of mismatches seen on a real design in different runs of same testcase.

| Test Run # | Value mismatches at cycle 0 | Value mismatches at cycle $N_1$ | Value mismatches at cycle $N_2$ | Value mismatches at cycle $N_3$ | Value mismatches at cycle $N_4$ |
|---|---|---|---|---|---|
| 1 | 0 | 5268 | 17140 | 18104 | 15526 |
| 2 | 0 | 5094 | 17503 | 18058 | 15280 |
| 3 | 0 | 5072 | 17505 | 18104 | 15280 |

A design behaves differently when the same testcase is executed repeatedly. As the failure moves from run to run, a deterministic method is needed to isolate the source of the issue.

SUMMARY

Disclosed is a configuration (e.g., system, method, non-transitory computer readable stored medium comprises stored instructions executable by a processor) for testing a design of an electronic circuit during a set of clock cycles. A testcase is received. The testcase identifies a subset of clock cycles of the set of clock cycles, and one or more commands to be executed during each of the clock cycles of the subset of clock cycles. A test output of the design is received. The test output is based on the received testcase. The test output includes output values for each object of interest of the design during each clock cycle of the set of clock cycles.

The test output is filtered based on the received testcase to generate a filtered test output. To filter the test output, for each clock cycle of the subset of clock cycles of the testcase, a list of objects of interest associated with a previous clock cycle in the subset of clock cycles of the test case is identified. Moreover, one or more objects of interest associated with the one or more commands to be executed during the clock cycle is also identified. Then an updated list is generated by augmenting the list of objects of interest associated with the previous clock cycle in the subset of clock cycles of the test case with the one or more objects of interest associated with the one or more commands to be executed during the clock cycle. Output values for objects of interest included in the updated list of objects of interest is selected. In some embodiments, the test output is filtered by removing output values of objected of interest that are not selected using this process. The filtered test output is then stored in an activity database.

In one embodiment, a second test output for the design is received. The second output is filtered based on the received testcase to generate a second filtered test output. The first filtered test output is compared with the second filtered test output to determine if a mismatch between the first filtered test output and the second filtered test output is present. If any mismatch is identified, an indication of the mismatch is presented to the user for further processing.

In one embodiment, to determine whether a mismatch between the first and second filtered test output is present, for each output value in the first filtered test output, a determination is made whether the output value in the first filtered test output matches a corresponding output value in the second filtered test output.

In one embodiments, for each mismatching output value, an object identifier associated with the mismatching output value, a time associated with the mismatching output value, the output value in the filtered test output, and the corresponding output value in the filtered second test output are displayed to the user.

BRIEF DESCRIPTION OF THE DRAWINGS

The teachings of the embodiments can be readily understood by considering the following detailed description in conjunction with the accompanying drawings.

Figure 1:
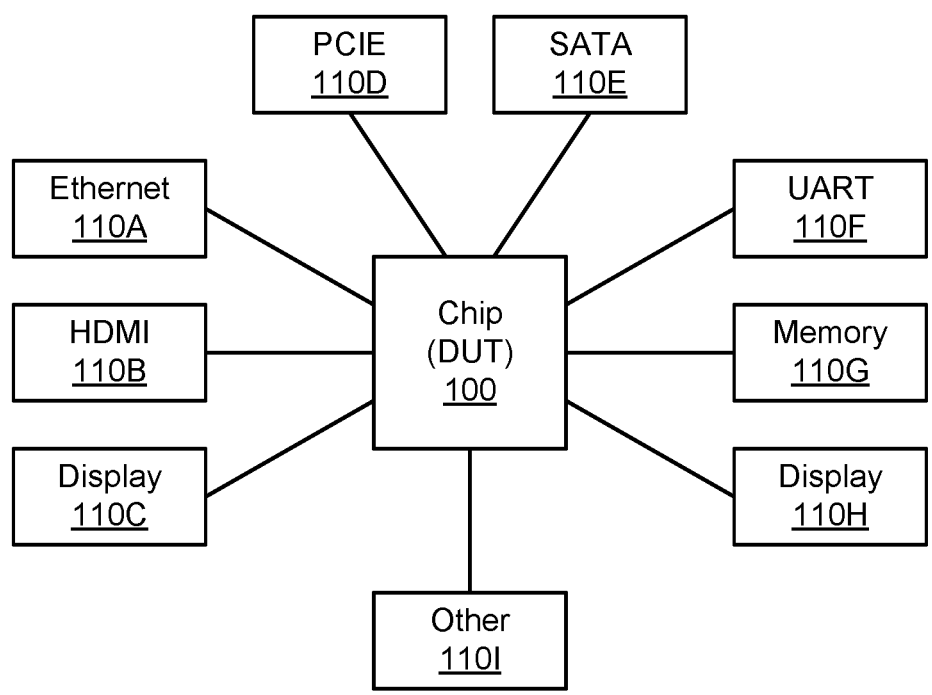
FIG. 1 illustrates a chip with asynchronous interfaces, according to one embodiment.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAIL DESCRIPTION

Configuration Overview

One example embodiment is centered around a new software development that intrinsically filters out all divergences that is unlikely to impact test success criteria. A typical design can have billions of signals that can behave differently from run to run. A typical testcase that runs a software application, could run for billions of cycles. For example, if a design has 1 billion gates and is emulated for 1 billion cycles, the search space would be equal to the product of the number of gates and the number of cycles (i.e., $10^{18}$ in this example). However, out of this search space, a very small subset of signals is tracked by the user to determine testcase success. A disclosed configuration filters out all divergences that are unlikely impact test success criteria, a tool presents a summary to the user and helps in debugging the root cause in a time bound manner.

An aspect of this embodiment is temporal optimization. In existing solutions, the values are compared on each cycle. The proposed solution uses a new algorithm to identify specific time or cycle count where a design is exercised directly through a testbench. The testbench activity is synonymous with user intent to either drive execution in a certain way or to monitor specific behavior. Thus, any mismatch found at that specific time becomes very interesting to debug. By filtering out any divergence data at other cycles, the proposed solution reports only critical divergences that are potential root cause for the test failure.

A typical example is when a user creates a testcase to validate a specific scenario. As a design is mapped to an emulator, the user primarily depends on the commands or Application Programming Interface (APIs) provided by the emulation vendor, to interact with the design. A few examples of these commands can be, for example: forcing a design signal to a certain value, monitoring the value of a signal, reading or writing into a memory, checking the value of a certain signal, checking if specific condition is hit, etc. The execution flow and success criteria of the testcase is provided by the user, as an input, in terms of a sequence of such commands. In this embodiment, a spatial optimization is obtained by focusing on the signals that the user accesses during the testcase. Temporal optimization is obtained by focusing on specific cycles or times when such signals are accessed. That is, this embodiment eliminates "don't care signals" and "don't care cycles." By doing so, the embodiment is able to generate a report which is directly applicable to test success criteria and allows the user to pinpoint the issue quickly.

A solution developed through this embodiment may change on-the-fly according to the testcase run by the user. Through spatial and temporal optimizations, non-essential mismatches are filtered out, and a condensed summary of divergences that directly correspond to the success criteria of that specific testcase is generated. At the end of the test run, an entire list of meaningful divergences is reported along with a corresponding time stamp.

Automated Self-Check Based on Observability Score of Internal Nodes

In one embodiment, the search space is dynamically reduced from the entire design to "user-critical signals." The user critical set is defined as a set of critical signals/events including primary input/outputs of the design, testbench driven design manipulations, testbench driven observation points, Design Under Test (DUT) testbench connection interface, memory operations, etc. This set is typically a small subset of the overall design. In subsequent description, each member of this user-critical set may be referred to as an object of interest.

Some objects of interest are defined as part of design/testbench architecture. These objects of interest are common across all testcases and defined as static objects of interest. Primary input/outputs and DUT-testbench connection interface are key examples of such static objects of interest. Other objects of interest are defined by the user as part of a specific testcase. These objects of interest change depending on the testcase and are defined as dynamic objects of interest. Testbench driven design signal accesses are examples of such dynamic objects of interest. Table 2 shows a few data points from real designs to demonstrate the scale of spatial optimizations done by the proposed embodiment.

TABLE 2

Examples of Spatial Optimization on Real Designs

|  | Total Objects of interest in design | Objects of interest targeted | Spatial Optimization Gain % |
|---|---|---|---|
| Design #1 | ~6.2 Million | ~60 k | ~99% |
| Design #2 | ~109 Million | ~400 k | ~96% |

As design runs on a vendor platform, objects of interest are accessed as per the guidance provided by the user. By monitoring testbench activity, the proposed embodiment understands exact clock cycles when objects of interest are being accessed and skips all clock cycles where the user does not perform any operation of any design object of interest. This is how temporal optimization is achieved.

Figure 2:
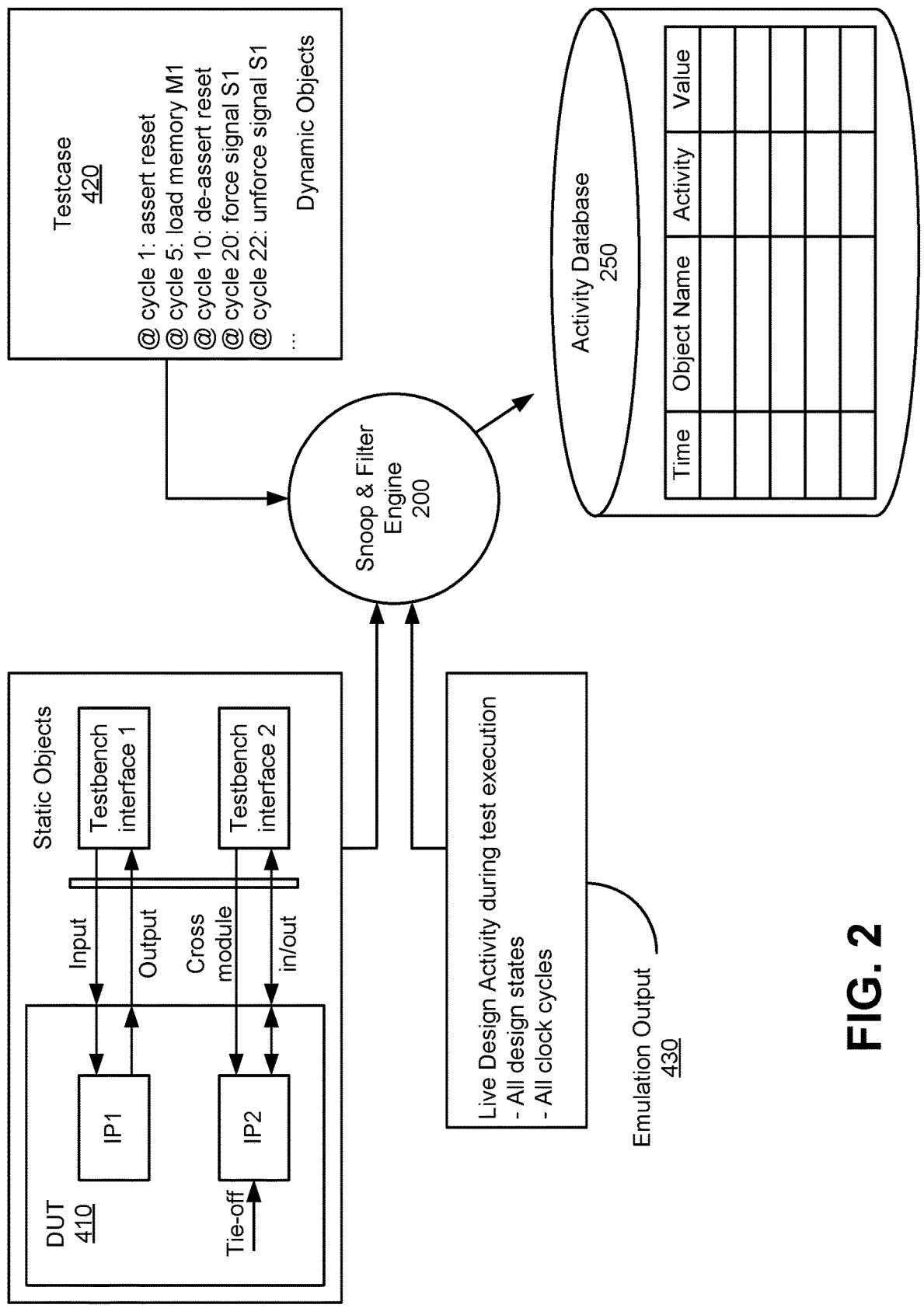
FIG. 2 illustrates a diagram for performing spatial and temporal optimization, according to one embodiment.

FIG. 2 illustrates a diagram for performing spatial and temporal optimization, according to one embodiment. A snoop and filter engine 200 automatically extracts both static and dynamic objects of interest during the main run of an emulation. The snoop and filter engine 200 also monitors the cycles when activity was done. The snoop and filter engine 200 captures and stores the object values in the activity database 250 only at these cycles. The activity database 250 stores a time (e.g., a clock cycle) associated with the stored object value, an object name associated with the object value, an activity associated with the object value, and the object value itself.

The snoop and filter engine 200 takes three inputs:
1) An emulation output 430: The snoop and filter engine 200 snoops the value of all design states at every cycle during test case execution. The emulation output 430 is the complete data set on which filtering would be applied.
2) The DUT 410: The snoop and filter engine 200 analyzes the DUT 410 and testbench setup provided by the user to extract list of static objects of interest.
3) A testcase 420: The snoop and filter engine 200 snoops on the user commands provided in the testcase 420 and extracts the information about which objects of interest are accessed and at what cycles they are accessed. The snoop and filter engine 200 additionally captures what type of activity was performed by the user on that object of interest.

The snoop and filter engine 200 performs a spatial optimization of the emulation output 430 by filtering all design states not present in the above-mentioned inputs. The snoop and filter engine 200 additionally performs a temporal optimization of the emulation output 430 by filtering all clock cycles that were not captured through the inputs.

Snoop and filter engine 200 produces an output in form of an activity database 250. That is, after the emulation output 430 is filtered out to perform a spatial and a temporal optimization, the filtered emulation output stored as a database for subsequent access during subsequent emulation runs of the design.

Figure 3A:
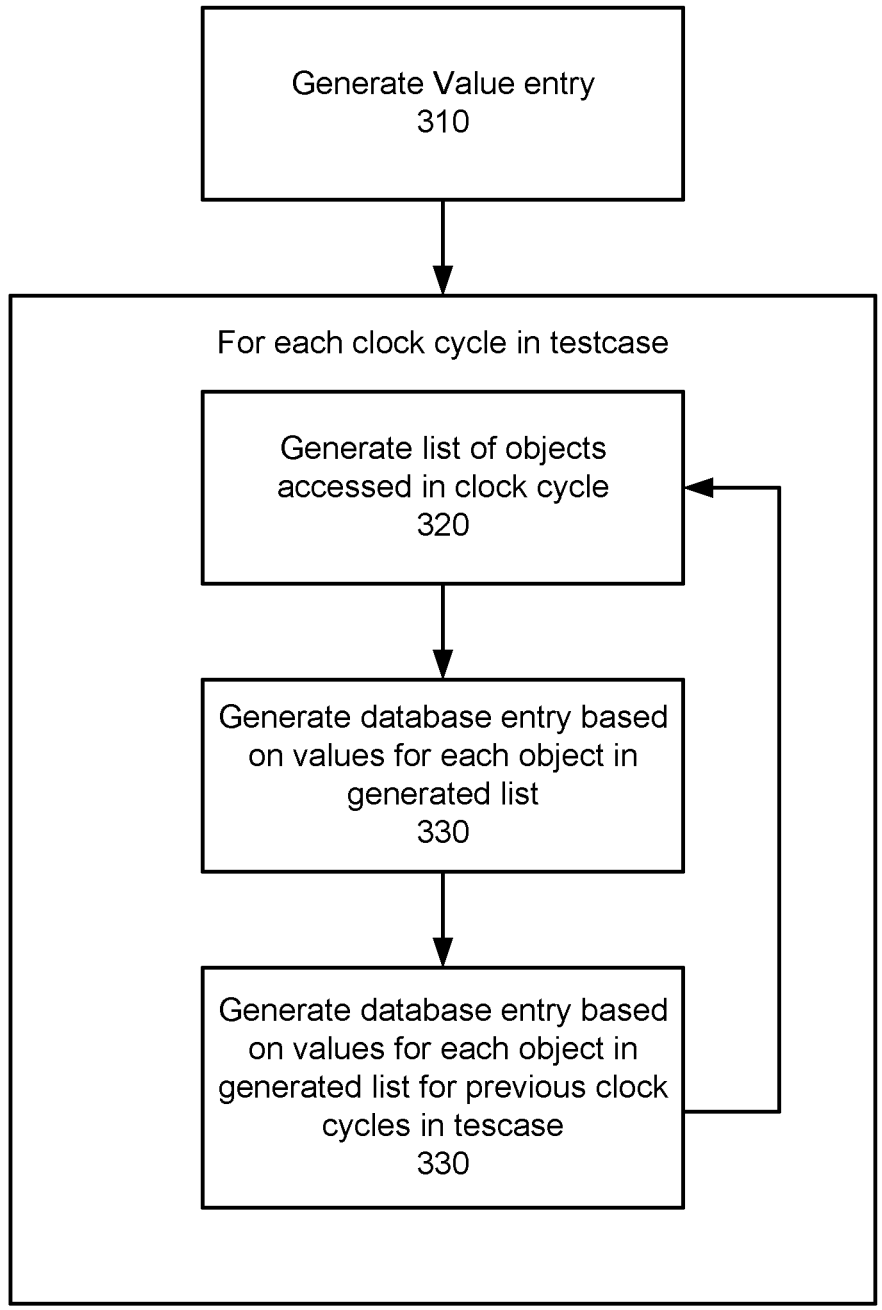
FIG. 3A illustrates a flow diagram of the process for generating the activity database 250, according to one embodiment.

FIG. 3A illustrates a flow diagram of the process for generating the activity database 250, according to one embodiment. In one embodiment, to generate the activity database 250, for each object of interest Oi, the snoop and filter engine 200 generates 310 a Value entry (Value[$O_i$][$T_k$]) at time of access $T_k$. The value includes object name, activity type, object value and time of access.

Value[$O_i$][$T_k$]=(Time of access, Object name, Activity type, value);

where Oi is an object of interest

Since at a given time $t_i$, multiple objects of interest may be accessed, the snoop and filter engine 200 generates 320 a list (List[$t_i$]) of objects of interest accessed at time $t_i$.

List[$t_i$]=($O_0$, $O_1$, $O_2$, . . . , $O_n$);

where n is the number of objects of interest accessed at time $t_i$

The snoop and filter engine then generates 330 a database entry (db[List[$t_i$]][$T_k$]). The database entry at time $T_k$ represents a combination of Value of each object of interest from a list at time $T_k$.

db[List[$t_i$]][$T_k$]=((Value[$O_n$][$T_k$])|$O_n \in$List[$t_i$])

In some embodiments. the database is stored in a matrix form and continues to grow with time. The snoop and filter engine 200 retrieves the Lists for previous times $t_i$ and generates 330 database entries at time $T_k$ for each of the Lists from $t_0$ to $T_k$. For example, the database may be stored as:

DataBase[$T_k$]=db[List[$t_0$]][$T_k$]∪db[List[$t_i$]][$T_k$]∪ . . . ∪db[List[$t_i$]][$T_k$]

Figure 3B:
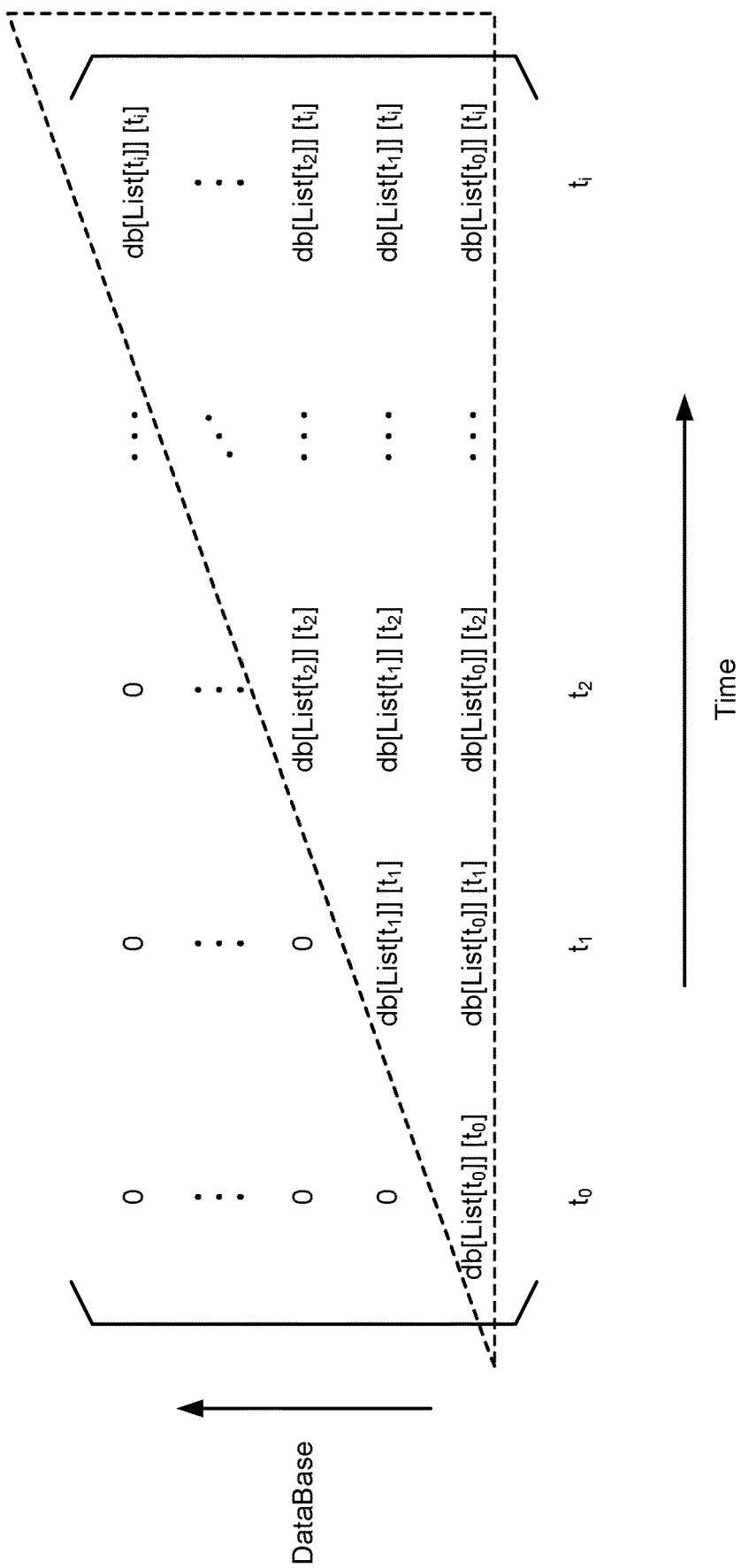
FIG. 3B illustrates both spatial and temporal improvements aspects built into the database.

FIG. 3B illustrates both spatial and temporal improvements aspects built into the database, according to one example embodiment. In FIG. 3B, each column represents actual time of access ($t_1$, $t_2$, etc.). Database entries are not done on every clock cycle. Instead, database entries are only stored for specific clock cycles identified by the snoop and filter engine 200 as being significant. There could be thousands of cycles between each sample points. In some embodiments, the snoop and filter engine 200 determines whether a clock cycle is significant based on the information provided in the testcase 420. For example, each clock cycle referenced in the testcase 420 may be considered by the snoop and filter engine 200 as being significant, and thus, stored in the activity database 250.

Each entry in the database shown in FIG. 3B represents the objects of interest that are accessed on that specific time. Thus, not all objects of interest are not monitored. Instead, only the objects of interest included in the lists generated by the snoop and filter engine 200 are monitored and stored in the activity database 250. In particular, the upper triangular half is considered null and void and represents the total optimization potential of this innovation.

Figure 4:
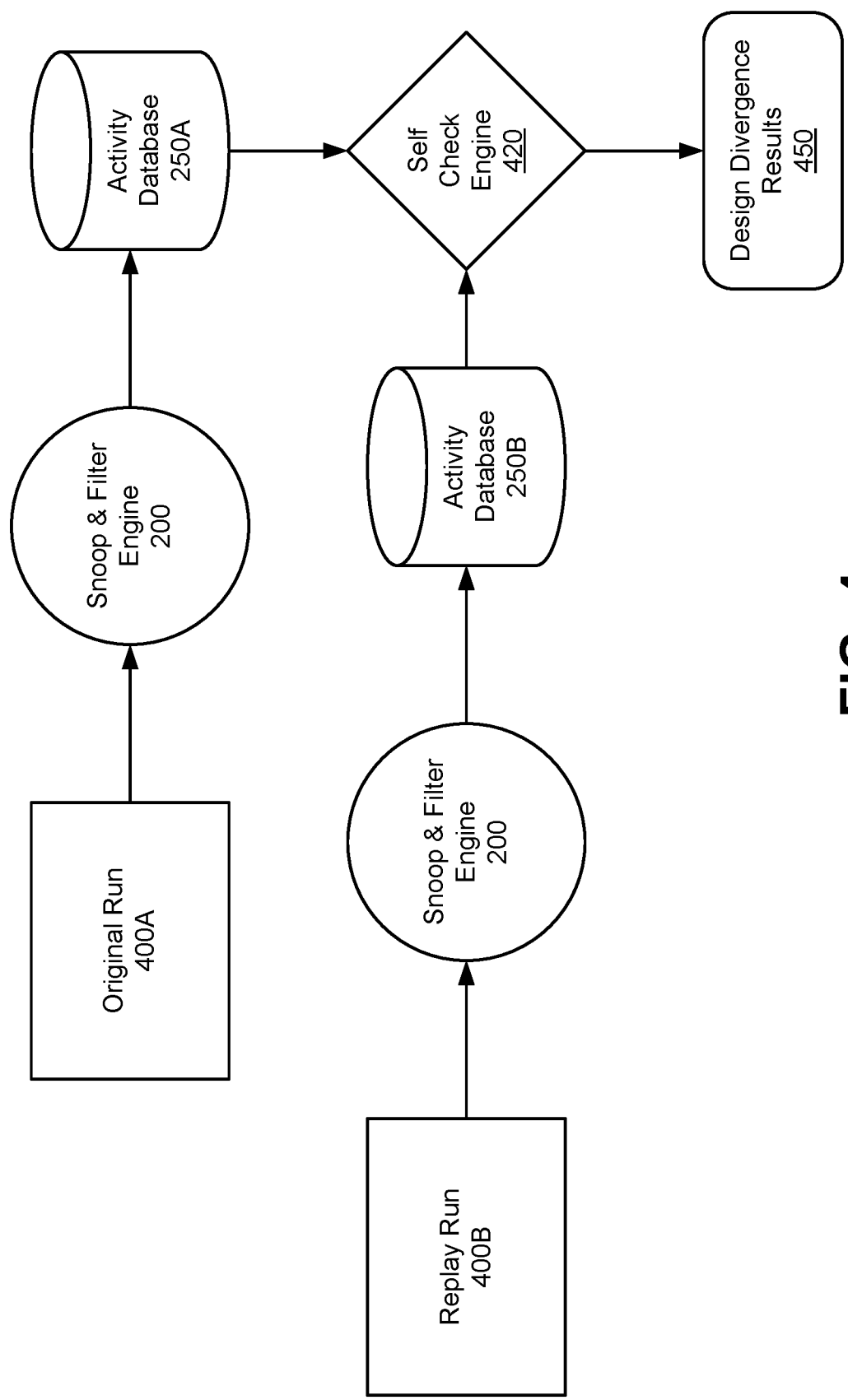
FIG. 4 illustrates a flow diagram of a method for performing a self-check test of two or more emulation runs of a design, according to one embodiment.

FIG. 4 illustrates a flow diagram of a method for performing a self-check test of two or more emulation runs of a design, according to one embodiment. In the embodiment of FIG. 4, a replay run 400B is compared against an original run 400A to determine if a divergent result is found between the two runs. When the testcase is run a second time to catch the source of design nondeterministic behavior, the snoop and filter engine 200 again follows the same flow to obtain new database values 250B. After a replay run 400B, a self-check engine 420 opens up previously stored activity database 250A from the original run 400A and makes a comparison with the current value stored in the activity database 250B. The comparison is made at every time unit when any user-critical signal is accessed (e.g. $t_1$, $t_2$, etc.). If the temporal values of critical signal set mismatches with the corresponding values recorded in the first run, they are stored in a temporary log place holder. At the end of the run, the entire output is provided back to the user.

If(ReplayDataBase[$T_k$]≠OriginalDataBase[$T_k$])

Print Value[$O_i$][$T_k$] where $O_i$ is an object of interest set mismatching at time $T_k$ Through temporal comparison of user-essential signals only at the time of access, this innovation presents a summary of mismatches that includes time of mismatch, name of mismatching object of interest, type of activity at the time of mismatch and mismatching values. This combination of temporal and spatial optimization in debug process results in deterministic debug of a non-deterministic problem.

In some embodiments, the summary of mismatches is presented through a graphical user interface in a computer device of a user. In some embodiments, the graphical user interface automatically changes upon completion of an emulation run of a design of an electronic circuit.

Computing Machine Architecture

Figure 5:
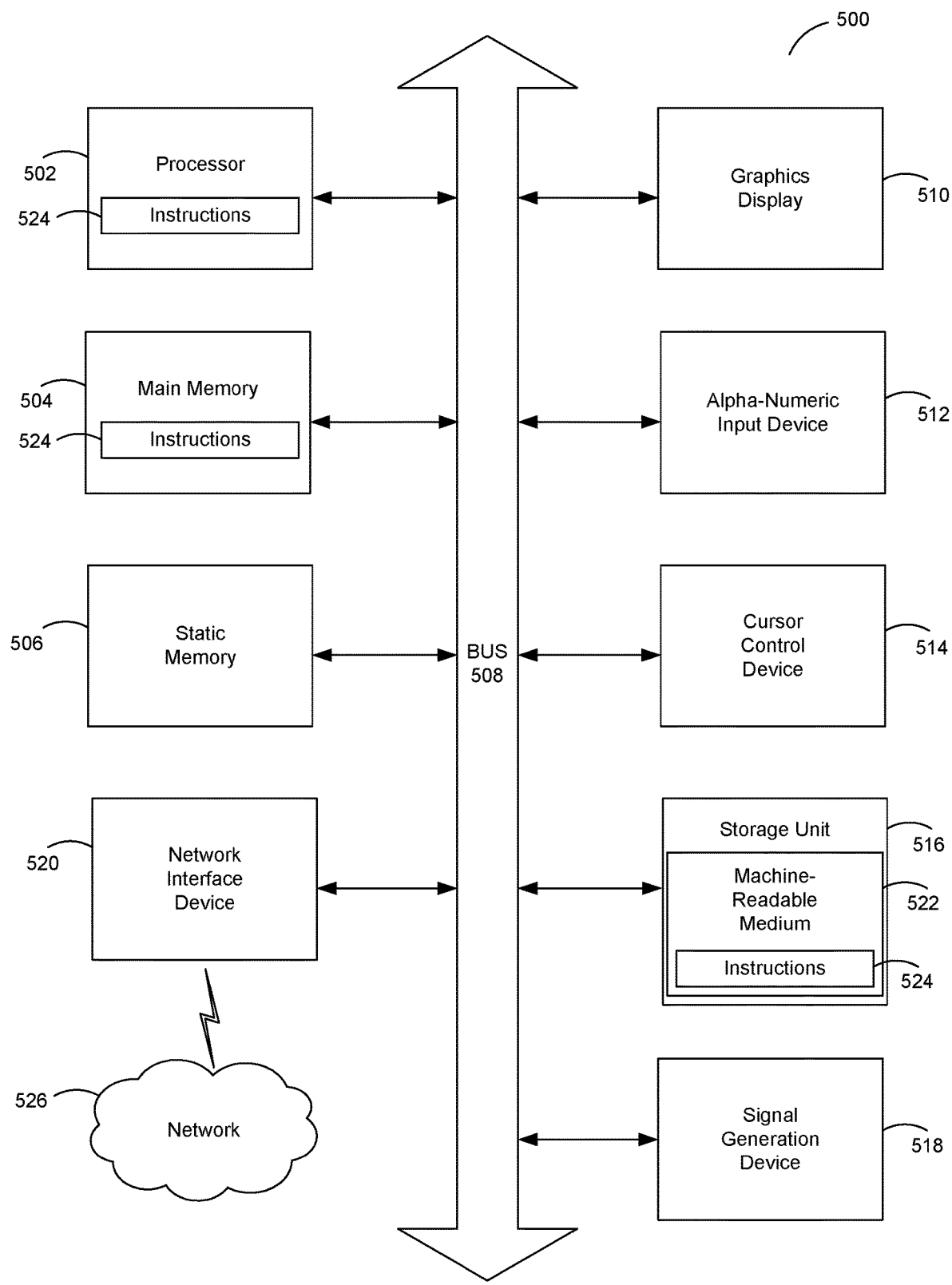
FIG. 5 shows components of an example machine that reads instructions from a machine-readable medium and execute them in a processor (or controller), according to one embodiment.

FIG. 5 is a block diagram illustrating components of an example machine able to read instructions from a machine-readable medium and execute them in a processor (or controller). Specifically, FIG. 5 shows a diagrammatic representation of a machine in the example form of a computer system 500 within which instructions 524 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), a tablet PC, a personal digital assistant (PDA), a smartphone, a web appliance, a network router, switch or bridge, or any machine capable of executing instructions 524 (sequential or otherwise) that specify actions to be taken by that machine. Further, while only a single machine is illustrated, the term "machine" shall also be taken to include any collection of machines that individually or jointly execute instructions 524 to perform any one or more of the methodologies discussed herein. In addition, some machine configuration may use only a portion of the disclosed components. Moreover, the machine may be communicatively coupled with an emulator. An example emulator is described with FIG. 7.

The example computer system 500 includes a processor 502 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 504, and a static memory 506, which are configured to communicate with each other via a bus 508. The computer system 500 may further include graphics display unit 510 (e.g., a plasma display panel (PDP), a liquid crystal display (LCD), a projector, or a cathode ray tube (CRT)). The computer system 500 may also include alphanumeric input device 512 (e.g., a keyboard), a cursor control device 514 (e.g., a mouse, a trackball, a joystick, a motion sensor, or other pointing instrument), a storage unit 516, a signal generation device 518 (e.g., a speaker), and a network interface device 520, which also are configured to communicate via the bus 508.

The storage unit 716 includes a machine-readable medium 522 on which is stored instructions 524 (e.g., software) embodying any one or more of the methodologies or functions described herein. The instructions 524 (e.g., software) may also reside, completely or at least partially, within the main memory 504 or within the processor 502 (e.g., within a processor's cache memory) during execution thereof by the computer system 500, the main memory 504 and the processor 502 also constituting machine-readable media. The instructions 524 (e.g., software) may be transmitted or received over a network 526 via the network interface device 520.

While machine-readable medium 522 is shown in an example embodiment to be a single medium, the term "machine-readable medium" should be taken to include a single medium or multiple media (e.g., a centralized or distributed database, or associated caches and servers) able to store instructions (e.g., instructions 524). The term "machine-readable medium" shall also be taken to include any medium that is capable of storing instructions (e.g., instructions 524) for execution by the machine and that cause the machine to perform any one or more of the methodologies disclosed herein. The term "machine-readable medium" includes, but not be limited to, data repositories in the form of solid-state memories, optical media, and magnetic media.

Overview of EDA Design Flow

Figure 6:
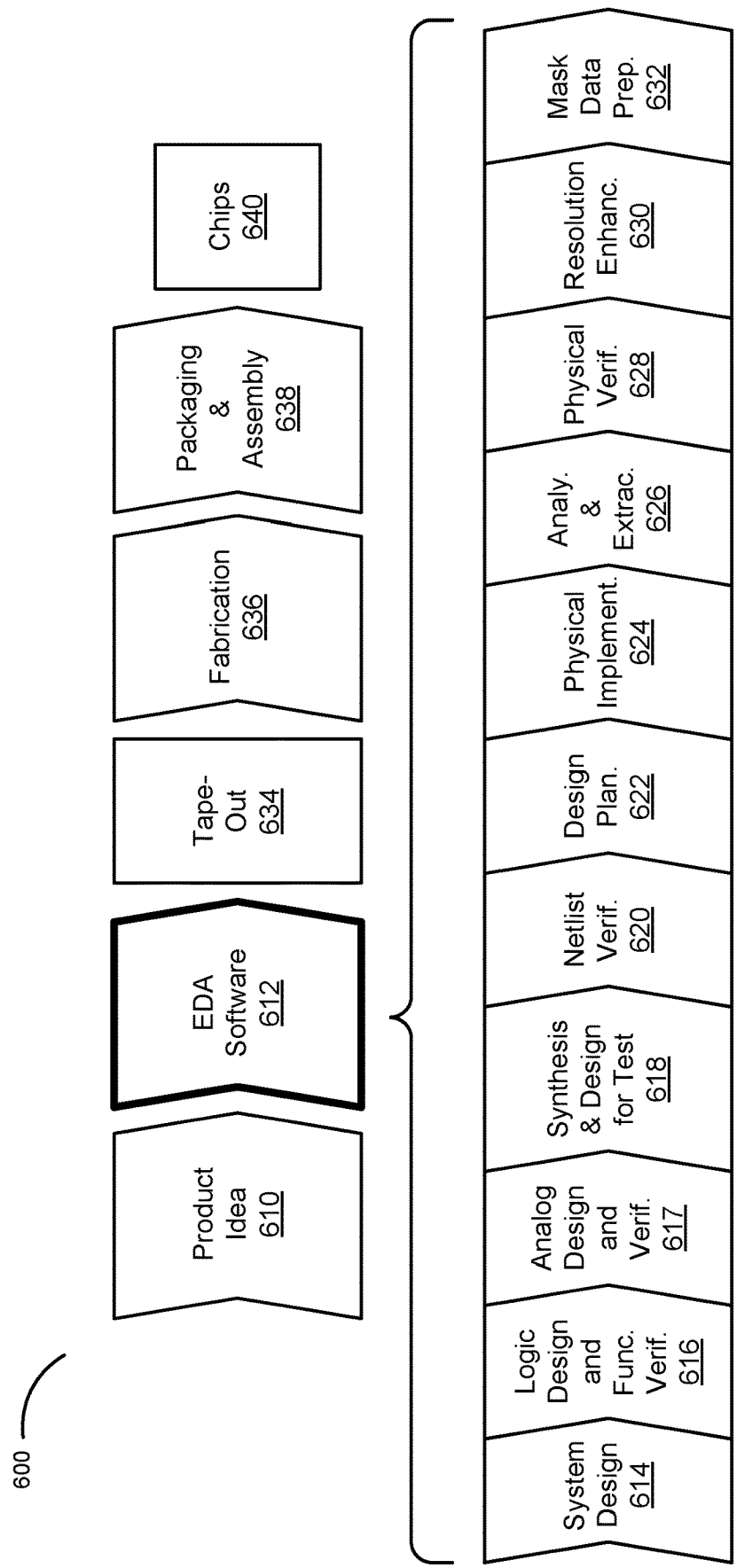
FIG. 6 shows a flowchart of various operations in the design and fabrication of an integrated circuit, according to one embodiment.

FIG. 6 illustrates various processes performed in the design, verification and fabrication of an item of manufacture such as an integrated circuit using software tools with a computer, and possibly special hardware-assisted tools, to transform and verify design data and instructions that represent the integrated circuit. The steps disclosed hereinabove may be perform throughout the design, verification and fabrication process, for example, during the logic design and functional verification step.

These processes start with the generation of a product idea 610 with information supplied by a designer, information which is transformed during a process to create an item of manufacture (referred to herein as a design or device) that uses an EDA software tool 612, which may also be signified herein as EDA software, as a design tool, or a verification tool. When the design is finalized, it can be taped-out 634, which typically is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed, which result in the finished integrated circuit 640 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 612 includes processes 614-632, which are described below. This design flow description is for illustration purposes only and is not meant to limit the present disclosure. For example, an actual integrated circuit design may require a designer to perform the design operations in a different sequence than the sequence described herein.

During system design 614, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 616, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS®, Vera®, Designware®, Magellan®, Formality®, ESP® and Leda® products. Exemplary emulator and prototyping products also available from Synopsys that can be used at this state include: Zebu® and Protolink®.

During analog design, layout, and simulation 617, analog circuits are designed, laid out, and simulated to ensure both functionality and performance. Example EDA software products from Synopsys, Inc. of Mountain View, Calif. that can be used at this stage include: Custom Compiler®, Hspice®, HspiceRF®, XA®, Nanosim®, HSim®, and Finesim® products.

During synthesis and design for test 818, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

During netlist verification 620, the netlist is checked for compliance with timing constraints and for correspondence with the HDL code. Exemplary EDA software products from Synopsys, Inc. of Mountain View, Calif. that can be used at this stage include: Formality®, Primetime®, and VCS® products.

During design planning 622, an overall floor plan for the integrated circuit is constructed and analyzed for timing and top-level routing. Exemplary EDA software products from Synopsys, Inc. of Mountain View, Calif. that can be used at this stage include: Astro® and IC Compiler® products.

During layout implementation 624, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro® and IC Compiler® products.

During analysis and extraction 626, the circuit function is verified at the layout level, which permits refinement of the layout design. Exemplary EDA software products from Synopsys, Inc. of Mountain View, Calif. that can be used at this stage include: Astrorail®, Primerail®, Primetime®, and Star RC/XT® products.

During physical verification 628, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules® product.

During resolution enhancement 630, geometric manipulations of the layout are performed to improve manufacturability of the design. Exemplary EDA software products from Synopsys, Inc. of Mountain View, Calif. that can be used at this stage include: Proteus® products.

During tape-out, data is created to be used (after lithographic enhancements are applied if appropriate) for production of lithography masks. Example EDA software products from Synopsys, Inc., that can be used during tape-out include the IC Compiler® and Custom Designer® families of products.

During mask-data preparation 632, the 'tape-out' data is used to produce lithography masks that are used to produce finished integrated circuits. Exemplary EDA software products from Synopsys, Inc. of Mountain View, Calif. that can be used at this stage include the CATS® family of products.

Emulation Environment

Figure 7:
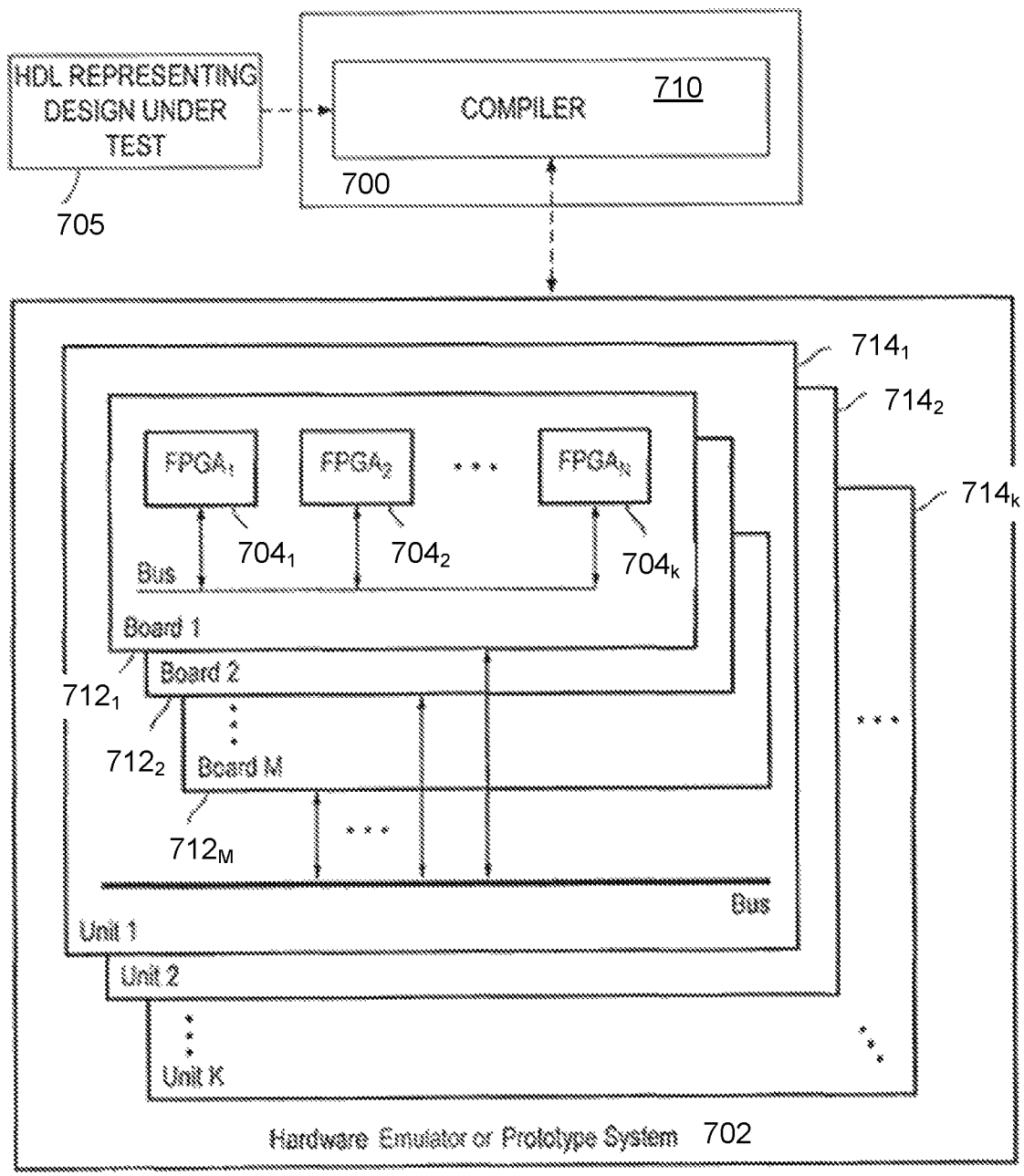
FIG. 7 depicts a block diagram of an emulation system, according to one embodiment.

An EDA software system, such as element 612 depicted in FIG. 6, typically includes an emulation system (for example at 616 in the EDA process) to verify the functionality of the circuit design. FIG. 7 depicts a typical emulation environment that includes a host computer system 700 (which may be part of an EDA system) and an emulator system 702 (typically a set of programmable devices such as Field Programmable Gate Arrays (FPGAs)). The host system 700 may have some or all of the components of the machine 500. The host system 700 generates data and information, typically using a compiler 210, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZEBU Server available from SYNOPSYS, INC.

The host system 700 comprises one or more processors. In the embodiment where the host system is comprised of multiple processors, the functions described herein as being performed by the host system may be distributed among the multiple processors.

The host system 700 typically includes a compiler 710 that processes code written in a hardware description language that represents a DUT, producing data (typically binary) and information that is used to configure the emulation system 702 to emulate the DUT. The compiler 710 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $704_1$ to $704_N$ in FIG. 7. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $704_1$-$704_N$ may be placed into one or more hardware boards $712_1$ through $712_M$. Many of such boards may be placed into a hardware unit, e.g. $714_1$. The boards within a unit may be connected using the backplane of the unit or any other types of connections. In addition, multiple hardware units (e.g., $714_1$ through $714_K$) may be connected to each other by cables or any other means to form a multi-unit system. In general, the hardware emulation or prototype system 702 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system receives (e.g., from a user or from a data store) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/re-emulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

Additional Configuration Considerations

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A method for testing a design of an electronic circuit during a plurality of clock cycles, the method comprising:
   receiving a testcase identifying a subset of clock cycles of the plurality of clock cycles, and one or more commands to be executed during each clock cycle of the subset of clock cycles;
   receiving a test output for the design of the electronic circuit based on the received testcase, the test output including output values for an object of interest of the design during a clock cycle of the plurality of clock cycles;
   filtering the test output based on the received testcase, comprising, for eaeh a current clock cycle of the subset of clock cycles of the testcase:
      identifying a list of objects of interest associated with a previous clock cycle of the current clock cycle of the subset of clock cycles of the testcase,
      identifying one or more objects of interest associated with the one or more commands to be executed during the current clock cycle,
      generating an updated list of objects of interest by adding the identified one or more objects of interest to the list of objects of interest associated with the previous clock cycle, and
      selecting the output values for objects of interest included in the updated list of objects of interest; and
   storing the filtered test output.

2. The method of claim 1, wherein the objects of interest of the design of the electronic circuit comprises one or more of logic gates, one or more memory elements, one or more interfaces, and one or more signal access points.

3. The method of claim 1, further comprising:
   receiving a second test output for a second design of the electronic circuit based on a second testcase,
   filtering the second test output based on the second testcase;
   determining whether the filtered test output differs from the filtered second test output; and
   providing an indication of a mismatch between the filtered test output and the filtered second test output to a user.

4. The method of claim 3, wherein the second testcase is the same as the first testcase, and the first design is the same as the second design of the electronic circuit.

5. The method of claim 3, wherein determining whether the filtered test output differs from the filtered second test output comprises:
   for an output value of the selected output values in the filtered test output, determining if the output value in the filtered test output matches a corresponding output value in the filtered second test output.

6. The method of claim 5, wherein providing an indication of a mismatch between the filtered test output and the filtered second test output to a user comprises:
responsive to the output value being mismatched, displaying an object identifier associated with the mismatched output value, a time associated with the mismatched output value, the output value in the filtered test output, the corresponding output value in the filtered second test output, and an activity type information associated with the mismatched output value.

7. The method of claim 1, wherein storing the filtered test output comprises:
storing at least the selected output values and an activity type information for objects of interest included in the updated list of objects of interest.

8. The method of claim 1, wherein generating an updated list of objects of interest by adding the identified one or more objects of interest to the list of objects of interest associated with the previous clock cycle comprises:
for an object of interest in the identified one or more objects of interest, determining whether the object of interest is included in the list of objects of interest associated with the previous clock cycle; and
responsive to determining that the object of interest is not included in the list of objects of interest associated with the previous clock cycle, adding the object of interest to the list of objects of interest associated with the previous clock cycle.

9. The method of claim 1, wherein receiving the test output for the design of the electronic circuit comprises:
performing an emulation of the design of the electronic circuit based on the received test case; and
recording signal values at a netlist of the design during a clock cycle of the plurality of clock cycles.

10. The method of claim 9, wherein performing an emulation of the design of the electronic circuit comprises receiving a manual input through an interface, and wherein filtering the test output further comprises:
identifying a clock cycle when the manual input was received;
adding the identified clock cycle to the subset of clock cycles;
identifying a list of objects of interest associated with a clock cycle in the subset of clock cycles preceding the identified clock cycle;
generating an updated list of objects of interest for the identified clock cycle by:
adding one or more objects of interest associated with the interface to the list of objects of interest associated with the clock cycle in the subset of clock cycles preceding the identified clock cycle, and
selecting output values for objects of interest included in the updated list of objects of interest for the identified clock cycle.

11. The method of claim 1, wherein filtering the test output further comprises:
filtering out, for a clock cycle of the subset of clock cycles of the testcase, output values for objects of interest not included in the updated list of objects of interest; and
filtering out output values associated with clock cycles not included in the subset of clock cycles of the test case.

12. A non-transitory computer readable storage medium comprising stored instructions for testing a design of an electronic circuit during a plurality of clock cycles, the instructions when executed by a processor cause the processor to:
receive a testcase identifying a subset of clock cycles of the plurality of clock cycles, and one or more commands to be executed during each clock cycle of the subset of clock cycles;
receive a test output for the design of the electronic circuit based on the received testcase, the test output including output values for an object of interest of the design during a clock cycle of the plurality of clock cycles;
filter the test output based on the received testcase, wherein the instructions for filtering the test out further causes the processor to, for a current clock cycle of the subset of clock cycles of the testcase:
identify a list of objects of interest associated with a previous clock cycle of the current clock cycle of the subset of clock cycles of the testcase,
identify one or more objects of interest associated with the one or more commands to be executed during the clock cycle,
generate an updated list of objects of interest by adding the identified one or more objects of interest to the list of objects of interest associated with the previous clock cycle, and
select the output values for objects of interest included in the updated list of objects of interest; and
store the filtered test output.

13. The non-transitory computer readable storage medium of claim 12, further comprising stored instructions that when executed causes the processor to:
receive a second test output for a second design of the electronic circuit based on a second testcase,
filter the second test output based on the second testcase;
determine whether the filtered test output differs from the filtered second test output; and
provide an indication of a mismatch between the filtered test output and the filtered second test output to a user.

14. The non-transitory computer readable storage medium of claim 13, wherein the second testcase is the same as the first testcase, and the first design is the same as the second design of the electronic circuit.

15. The non-transitory computer readable storage medium of claim 13, wherein the stored instructions to determine whether the filtered test output differs from the filtered second test output further comprises stored instruction that when executed causes the processor to:
determine, for an output value of the selected output values in the filtered test output, if the output value in the filtered test output matches a corresponding output value in the filtered second test output.

16. The non-transitory computer readable storage medium of claim 15, wherein the stored instructions to provide an indication of a mismatch between the filtered test output and the filtered second test output to a user further comprises stored instructions that when executed causes the processor to:
provide for display, responsive to the output value being mismatched, an object identifier associated with the mismatched output value, a time associated with the mismatched output value, the output value in the filtered test output, the corresponding output value in the filtered second test output, and an activity type information associated with the mismatched output value.

17. The non-transitory computer readable storage medium of claim 12, wherein the stored instructions to store the filtered test output further comprises stored instructions that when executed causes the processor to:

store at least the selected output values and an activity type information for objects of interest included in the updated list of objects of interest.

18. The non-transitory computer readable storage medium of claim 12, wherein the stored instructions to generate an updated list of objects of interest by adding the identified one or more objects of interest to the list of objects of interest associated with the previous clock cycle further comprises stored instruction that when executed causes the processor to:

for an object of interest in the identified one or more objects of interest, determine whether the object of interest is included in the list of objects of interest associated with the previous clock cycle; and responsive to determining that the object of interest is not included in the list of objects of interest associated with the previous clock cycle, add the object of interest to the list of objects of interest associated with the previous clock cycle.

19. The non-transitory computer readable storage medium of claim 18, wherein the instructions to filter the test output further comprises stored instructions that when executed causes the processor to:

identify a clock cycle when a manual input was received through an interface;

add the identified clock cycle to the subset of clock cycles;

identify a list of objects of interest associated with a clock cycle in the subset of clock cycles preceding the identified clock cycle;

generate an updated list of objects of interest for the identified clock cycle by:

adding one or more objects of interest associated with the interface to the list of objects of interest associated with the clock cycle in the subset of clock cycles preceding the identified clock cycle, and select output values for objects of interest included in the updated list of objects of interest for the identified clock cycle.

20. The non-transitory computer readable storage medium of claim 12, wherein the stored instructions to filter the test output further comprises stored instructions that when executed causes the processor to:

filter out, for a clock cycle of the subset of clock cycles of the testcase, output values for objects of interest not included in the updated list of objects of interest; and filter out output values associated with clock cycles not included in the subset of clock cycles of the test case.

* * * * *